(12) United States Patent
Zheng et al.

(10) Patent No.: US 9,479,280 B2
(45) Date of Patent: *Oct. 25, 2016

(54) EXTENDED CAVITY FABRY-PEROT LASER ASSEMBLY CAPABLE OF HIGH SPEED OPTICAL MODULATION WITH NARROW MODE SPACING AND WDM OPTICAL SYSTEM INCLUDING SAME

(75) Inventors: Jun Zheng, Missouri City, TX (US); Stefan J. Murry, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 457 days.

This patent is subject to a terminal disclaimer.

(21) Appl. No.: 13/543,259

(22) Filed: Jul. 6, 2012

(65) Prior Publication Data

US 2013/0016976 A1   Jan. 17, 2013

Related U.S. Application Data

(60) Provisional application No. 61/508,014, filed on Jul. 14, 2011, provisional application No. 61/508,008, filed on Jul. 14, 2011, provisional application No. 61/508,011, filed on Jul. 14, 2011, provisional application No. 61/527,587, filed on Aug. 25, 2011.

(51) Int. Cl.
*H04J 14/02* (2006.01)
*H04B 10/50* (2013.01)
(Continued)

(52) U.S. Cl.
CPC .............. *H04J 14/02* (2013.01); *H01S 5/146* (2013.01); *H04B 10/503* (2013.01);
(Continued)

(58) Field of Classification Search
None
See application file for complete search history.

(56) References Cited

U.S. PATENT DOCUMENTS 4,786,132 A    11/1988 Gordon
5,042,898 A    8/1991 Morey et al.
(Continued)

FOREIGN PATENT DOCUMENTS

JP    2000174397 A    6/2000
KR    20000049869 A    8/2000
(Continued)

OTHER PUBLICATIONS

US Office Action mailed Aug. 20, 2014, received in related U.S. Appl. No. 13/595,505, 15 pgs.

*Primary Examiner* — Li Liu
(74) *Attorney, Agent, or Firm* — Grossman Tucker Perreault & Pfleger, PLLC; Norman S. Kinsella (57) ABSTRACT

An extended cavity Fabry-Perot laser assembly provides relatively narrow mode spacing while allowing relatively high speed optical modulation. The extended cavity Fabry-Perot laser assembly generally includes an exit reflector physically separated from a laser emitter (e.g., a gain chip) to extend the lasing cavity and narrow the mode spacing while maintaining a relatively small gain region in the laser emitter capable of higher speed optical modulation. The extended cavity Fabry-Perot laser assembly may be used in a multi-channel transmitter in a wavelength division multiplexed (WDM) optical system that selects a channel wavelength for the transmitter from among multiple channel wavelengths emitted by the laser assembly. The narrow mode spacing may be less than a WDM channel width, and more specifically, may be less than a channel passband of an arrayed waveguide grating (AWG) or other filter used to select the channel wavelength.

8 Claims, 5 Drawing Sheets

(51) Int. Cl.
*H04B 10/572* (2013.01)
*H01S 5/14* (2006.01)

(52) U.S. Cl.
CPC ......... *H04B 10/506* (2013.01); *H04B 10/572* (2013.01); *H04J 14/025* (2013.01); *H04J 14/0246* (2013.01); *H04J 14/0282* (2013.01)

(56) References Cited

U.S. PATENT DOCUMENTS

| | | | |
|---|---|---|---|
| 5,305,336 A * | 4/1994 | Adar et al. | 372/18 |
| 5,499,256 A | 3/1996 | Bischel et al. | |
| 5,732,102 A | 3/1998 | Bouadma | |
| 5,757,828 A | 5/1998 | Ouchi | |
| 5,937,120 A | 8/1999 | Higashi | |
| 5,987,200 A | 11/1999 | Fleming et al. | |
| 6,111,999 A | 8/2000 | Espindola et al. | |
| 6,118,562 A | 9/2000 | Lee et al. | |
| 6,188,705 B1 | 2/2001 | Krainak et al. | |
| 6,215,809 B1 * | 4/2001 | Ziari | H01S 3/094003 356/460 |
| 6,275,629 B1 | 8/2001 | Eggleton et al. | |
| 6,303,040 B1 | 10/2001 | Oh et al. | |
| 6,411,746 B1 | 6/2002 | Chamberlain et al. | |
| 6,480,513 B1 * | 11/2002 | Kapany | H01S 5/146 372/102 |
| 6,580,734 B1 * | 6/2003 | Zimmermann | H01S 5/0612 372/29.011 |
| 6,625,182 B1 * | 9/2003 | Kuksenkov et al. | 372/19 |
| 6,625,192 B2 * | 9/2003 | Arbel | H01S 5/026 372/102 |
| 6,683,895 B2 | 1/2004 | Pilgrim et al. | |
| 6,741,629 B1 | 5/2004 | Garnache et al. | |
| 6,853,671 B2 | 2/2005 | Liu et al. | |
| 6,917,636 B2 | 7/2005 | Blauvelt et al. | |
| 6,920,159 B2 | 7/2005 | Sidorin et al. | |
| 6,973,106 B1 * | 12/2005 | Chaoui | H01S 3/06754 372/34 |
| 7,027,469 B2 | 4/2006 | Sidorin et al. | |
| 7,565,084 B1 * | 7/2009 | Wach | H04J 14/04 398/183 |
| 7,899,105 B1 | 3/2011 | Hargis et al. | |
| 2002/0018507 A1 | 2/2002 | Deacon | |
| 2004/0018018 A1 * | 1/2004 | Izadpanah | F16K 37/0075 398/77 |
| 2004/0258360 A1 * | 12/2004 | Lim | B82Y 20/00 385/43 |
| 2005/0123300 A1 * | 6/2005 | Kim et al. | 398/84 |
| 2005/0129402 A1 * | 6/2005 | Kim et al. | 398/79 |
| 2005/0180474 A1 * | 8/2005 | Buchold | H01S 5/06 372/38.08 |
| 2005/0232314 A1 * | 10/2005 | Hashimoto | 372/18 |
| 2006/0002443 A1 * | 1/2006 | Farber | H01S 5/141 372/50.1 |
| 2006/0182446 A1 | 8/2006 | Kim et al. | |
| 2007/0160106 A1 | 7/2007 | Hunter et al. | |
| 2007/0264020 A1 * | 11/2007 | Li | H04J 14/02 398/135 |
| 2010/0208756 A1 | 8/2010 | Noh | |
| 2010/0232458 A1 | 9/2010 | Kim et al. | |
| 2013/0223844 A1 * | 8/2013 | Hwang | 398/91 |

FOREIGN PATENT DOCUMENTS

| | | |
|---|---|---|
| KR | 20000051030 A | 8/2000 |
| WO | 03012936 A2 | 2/2003 |

* cited by examiner

EXTENDED CAVITY FABRY-PEROT LASER ASSEMBLY CAPABLE OF HIGH SPEED OPTICAL MODULATION WITH NARROW MODE SPACING AND WDM OPTICAL SYSTEM INCLUDING SAME

CROSS-REFERENCE TO RELATED APPLICATIONS

The present application claims the benefit of U.S. Provisional Patent Application Ser. No. 61/508,014 filed on Jul. 14, 2011, U.S. Provisional Patent Application Ser. No. 61/508,008 filed on Jul. 14, 2011, and U.S. Provisional Patent Application Ser. No. 61/508,011 filed on Jul. 14, 2011, and U.S. Provisional Patent Application Ser. No. 61/527,587 filed on Aug. 25, 2011, which are fully incorporated herein by reference.

TECHNICAL FIELD

The present invention relates to lasers and more particularly, to an extended cavity Fabry-Perot laser assembly that is capable of relatively high speed optical modulation and provides relatively narrow mode spacing.

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

An extended cavity Fabry-Perot laser assembly, consistent with embodiments disclosed herein, provides relatively narrow mode spacing while allowing relatively high speed optical modulation. The extended cavity Fabry-Perot laser assembly generally includes an exit reflector physically separated from a laser emitter (e.g., a gain chip) to extend the lasing cavity and narrow the mode spacing while maintaining a relatively small gain region in the laser emitter capable of higher speed optical modulation. The extended cavity Fabry-Perot laser assembly may be used in a multi-channel transmitter in a wavelength division multiplexed (WDM) optical system that selects a channel wavelength for the transmitter from among multiple channel wavelengths emitted by the laser assembly. The narrow mode spacing may be less than a WDM channel width, and more specifically, may be less than a channel passband of an arrayed waveguide grating (AWG) or other filter used to select the channel wavelength.

In a dense WDM (DWDM) 100 GHz system, for example, the narrow mode spacing may be less than the channel width of about 0.8 nm and more specifically less than a passband of about 0.4 nm and may be capable of relatively high speed optical modulation at a data rate of at least about 1 Gigabit per second (Gbps). Examples of WDM optical systems in which a high speed Fabry-Perot laser assembly with narrow mode spacing may be used include the type disclosed in commonly-owned U.S. Provisional Patent Application Ser. No. 61/508,008, U.S. Provisional Patent Application Ser. No. 61/508,011, and U.S. patent application Ser. No. 13/543,310, filed concurrently herewith, all of which are fully incorporated herein by reference.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "narrow mode spacing" or "relatively narrow mode spacing" refers to a spacing of the longitudinal modes of the extended cavity of the FP laser assembly being less than the channel spacing in a WDM optical system such that multiple modes fit within a band of wavelengths associated with each channel. The term "high speed modulation" or "relatively high speed modulation" refers to optical modulation of the light emitted by the FP laser assembly at a data rate of at least about 1 Gbps.

As used herein, "interchangeable" refers to transmitters that are not limited to transmitting at a particular channel wavelength and may be used in multiple different nodes or terminals of a WDM optical system such as a WDM passive optical network (PON) without having to be substantially reconfigured. Interchangeable transmitters may be, but are not necessarily, identical. The term "coupled" as used herein refers to any connection, coupling, link or the like by which signals carried by one system element are imparted to the "coupled" element and "optically coupled" refers to coupling such that light from one element is imparted to another element. Such "coupled" devices are not necessarily directly connected to one another and may be separated by intermediate components or devices that manipulate or modify such signals.

Figure 1:
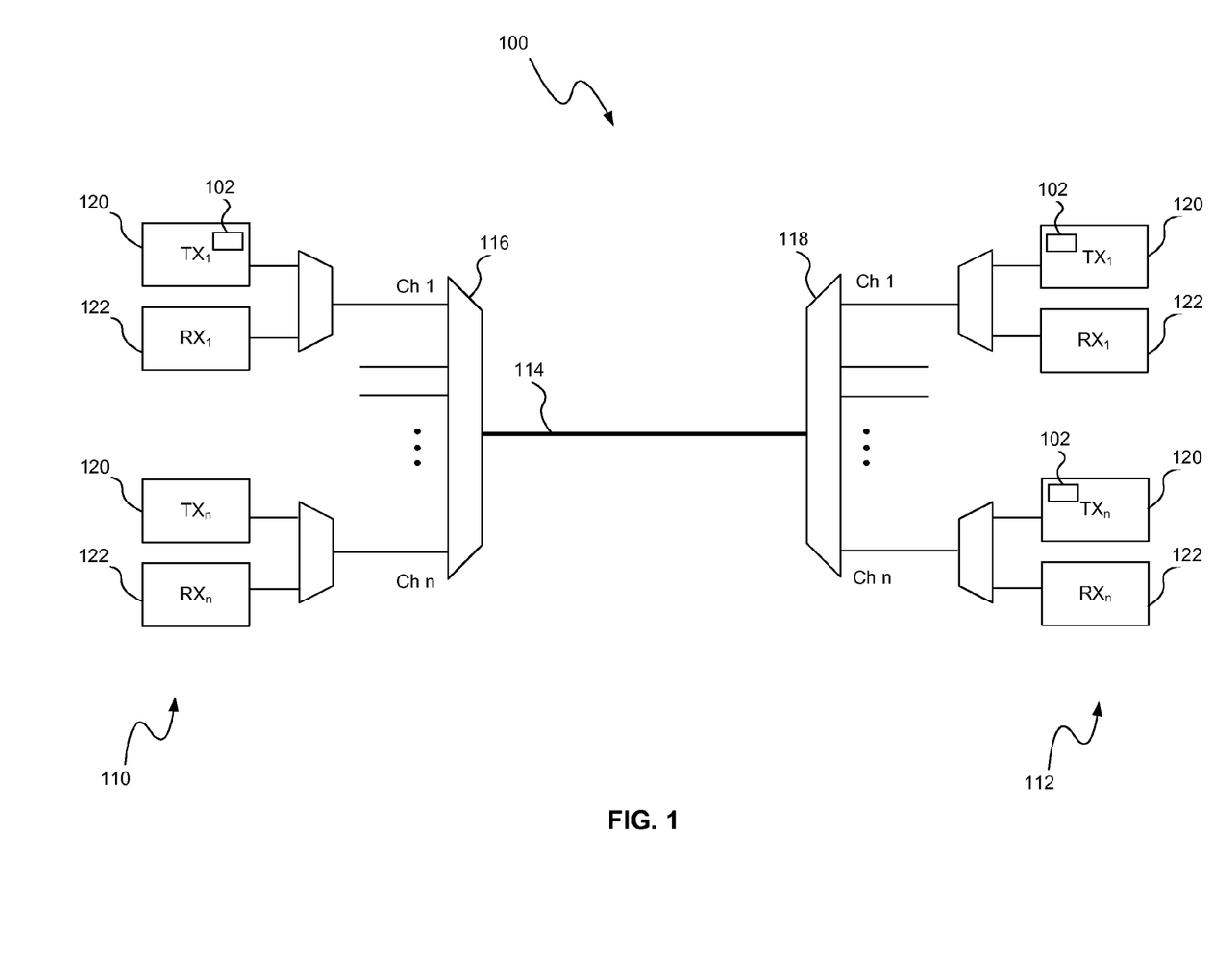
FIG. 1 is a diagrammatic view of a wavelength division multiplexed (WDM) optical communication system including multi-channel transmitters with extended cavity Fabry-Perot laser assemblies, consistent with an embodiment.

Referring to FIG. 1, a WDM optical communication system 100 including multi-channel transmitters with extended cavity Fabry-Perot (FP) laser assemblies, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $TX_1$ to $TX_n$) and receivers 122 (e.g., $RX_1$ to $RX_n$) associated with different channels (e.g., Ch. 1 to Ch. n) for transmitting and receiving optical signals between the one or more terminals 110, 112. Each terminal 110, 112 may include one or more transmitters 120 and receivers 122, and the transmitters 120 and receivers 122 may be separate or integrated as a transceiver within a terminal.

Although each of the transmitters 120 is associated with different respective channels and channel wavelengths, one or more of the transmitters 120 may be multi-channel transmitters configured to transmit optical signals at a plurality of channel wavelengths (e.g., a subset of the system channel wavelengths or all of the system channel wavelengths) instead of transmitting at only the associated channel wavelength. The multi-channel transmitters 120 may include extended cavity FP laser assemblies 102 capable of emitting light across a range of wavelengths including at least a subset of the system channel wavelengths (e.g., $\lambda_1$ to $\lambda_n$) used by the WDM system 100. The WDM system 100 filters the outputs from the multi-channel transmitters 120 to select the channel wavelengths associated with the respective transmitters for multiplexing and transmission on the trunk optical path 114. The extended cavity FP laser assemblies 102 are capable of relatively high speed optical modulation and provide a relatively narrow mode spacing such that multiple lasing modes fit within respective filter passbands when the associated wavelengths are selected.

Optical multiplexers/demultiplexers 116, 118 at each end of the WDM system 100 combine and separate the optical signals at the different channel wavelengths associated with the transmitters 120 and receivers 122. Aggregate WDM optical signals including the combined channel wavelengths are carried on the trunk optical path 114. The optical multiplexers 116, 118, for example, may include arrayed waveguide gratings (AWGs) that provide both filtering to select a different associated channel wavelength for each of the transmitters 120 and provide multiplexing to combine the selected associated channel wavelengths for transmission as a WDM signal over the optical path 114. Other types of filters may be used either in the optical multiplexers/demultiplexers 116, 118 or separately from the optical multiplexers/demultiplexers. By transmitting optical signals at multiple channel wavelengths and performing the wavelength selection separately from the multi-channel transmitters, the multi-channel transmitters are designed as universal transmitters capable of being used in different locations in the WDM system 100 and may be interchangeable with other multi-channel transmitters in the WDM system 100.

Figure 2:
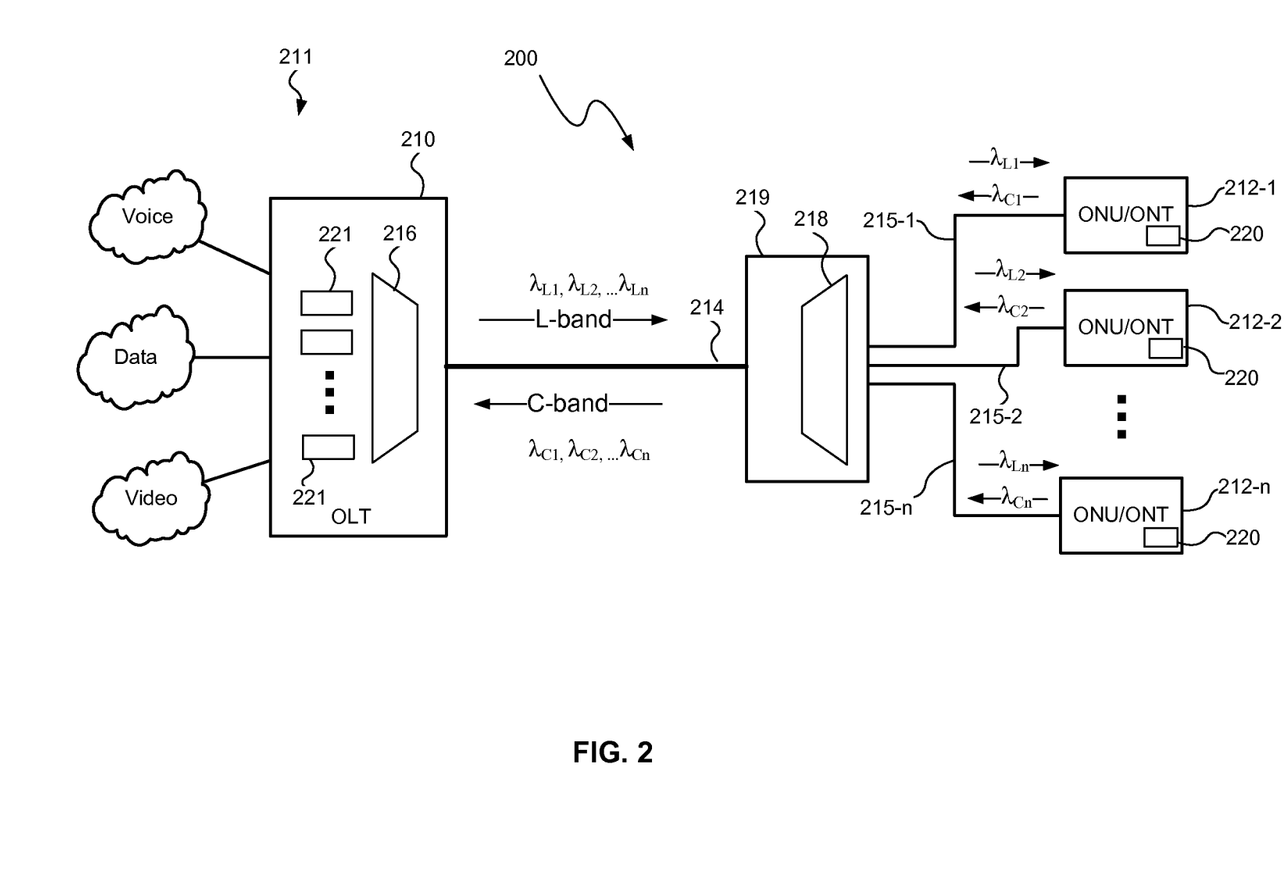
FIG. 2 is a diagrammatic view of a WDM passive optical network (PON) including multi-channel transmitters with extended cavity Fabry-Perot laser assemblies, consistent with an embodiment.

Referring to FIG. 2, one or more multi-channel transmitters with extended cavity FP laser assemblies, consistent with embodiments of the present disclosure, may be used in a WDM-PON 200. The WDM-PON 200 provides a point-to-multipoint optical network architecture using a WDM system. According to one embodiment of the WDM-PON 200, a central office (CO) 211 including one or more optical line terminals (OLTs) 210 may be coupled to a plurality of optical networking terminals (ONTs) or optical networking units (ONUs) 212-1 to 212-n via optical fibers, waveguides, and/or paths 214, 215-1 to 215-n. A branching point 219 couples the trunk optical path 214 to the separate optical paths 215-1 to 215-n to the ONUs/ONTs 212-1 to 212-n at the subscriber locations. The branching point 219 may include one or more passive coupling devices such as a splitter or optical multiplexer/demultiplexer. The ONUs/ONTs 212-1 to 212-n may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 219 and ONUs/ONTs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the CO 211 may be coupled to one or more sources or networks providing the voice, data and/or video.

In the WDM-PON 200, different ONUs/ONTs 212-1 to 212-n may be assigned different channel wavelengths and optical signals may be transmitted on the different channel wavelengths and combined and separated using WDM techniques. One or more of the ONUs/ONTs 212-1 to 212-n may thus include a multi-channel transmitter 220 for generating an optical signal at multiple channel wavelengths and the branching point 219 may include an AWG 218 for selecting an associated one of the multiple channel wavelengths and for combining the selected associated channel wavelengths for transmission to the OLT 210. Thus, the same device in the WDM-PON node that provides wavelength routing may be used to provide the filtering and wavelength selection. The OLT 210 may also include one or more multi-channel transmitters 221 for generating optical signals at multiple channel wavelengths and an AWG 216 for selecting associated ones of the multiple channel wavelengths and for combining the selected associated channel wavelengths for transmission to the ONUs/ONTs 212-1 to 212-n.

In one embodiment, the WDM-PON 200 may use different wavelength bands for transmission of downstream and upstream optical signals relative to the OLT 210. For example, the L-band (e.g., about 1565 to 1625 nm) may be used for downstream transmissions and the C-band (e.g., about 1530 to 1565 nm) may be used for upstream transmissions. The ONUs/ONTs 212-1 to 212-n may thus be assigned different channel wavelengths within the L-band and within the C-band. Transmitters in the OLT 210 may be configured to transmit optical signals on multiple channel wavelengths in the L-band, and transceivers or receivers located within the ONUs/ONTs 212-1 to 212-n may be configured to receive an optical signal on at least one channel wavelength in the L-band. Transceivers or transmitters located within the ONUs/ONTs 212-1 to 212-n may be configured to transmit optical signals on multiple channel wavelengths within the C-band. Other wavelengths and wavelength bands are also within the scope of the system and method described herein.

In the example embodiment, the multi-channel transmitters 221 in the OLT 110 may generate optical signals at a subset of or all of the channel wavelengths in the L-band (e.g., $\lambda_{L1}, \lambda_{L2}, \ldots \lambda_{Ln}$). Each of the extended cavity FP laser assemblies in the multi-channel transmitters 221 may be modulated by a respective RF signal to generate the respective optical signals, and the AWG 216 selects associated channel wavelengths (e.g., $\lambda_{L1}, \lambda_{L2}, \ldots \lambda_{Ln}$) for each of the respective transmitters 221 and combines the optical signals at the different associated channel wavelengths. The branching point 219 may demultiplex the downstream aggregate WDM optical signal (e.g., $\lambda_{L1}, \lambda_{L2}, \ldots \lambda_{Ln}$) from the OLT 210 for transmission of the separate channel wavelengths to the respective ONUs/ONTs 212-1 to 212-n. Alternatively, the branching point 219 may provide the aggregate WDM optical signal to each of the ONUs/ONTs 212-1 to 212-n and each of the ONUs/ONTs 212-1 to 212-n separates and processes the assigned optical channel wavelength. The individual optical signals may be encrypted to prevent eavesdropping on optical channels not assigned to a particular ONU/ONT.

In the example embodiment, the multi-channel transmitters 220 in one or more of the ONUs/ONTs 212-1 to 212-n may generate an optical signal at a subset of or all of the channel wavelengths in the C-band (e.g., $\lambda_{C1}, \lambda_{C2}, \ldots \lambda_{Cn}$). Each of the extended cavity FP laser assemblies in the multi-channel transmitters 220 may be modulated by a respective RF signal to generate the optical signal, and the AWG 218 in the branching point 219 selects associated channel wavelengths (e.g., $\lambda_{C1}, \lambda_{C2}, \ldots \lambda_{Cn}$) for each of the respective transmitters 220 and combines or multiplexes the upstream optical signals from the respective ONUs/ONTs 212-1 to 212-n for transmission as an aggregate WDM optical signal over the trunk optical path 214 to the OLT 210.

Figure 3:
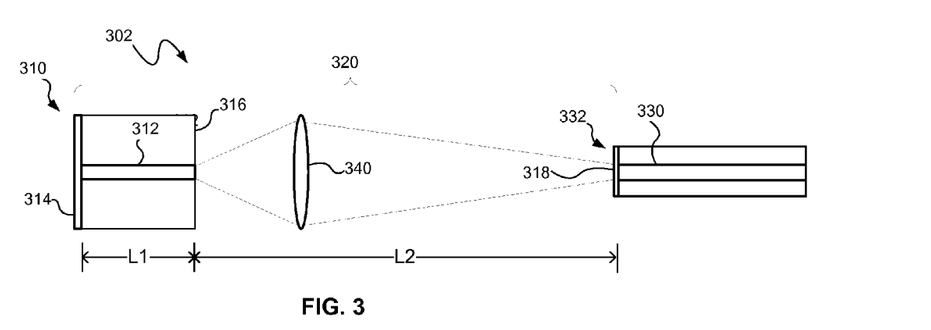
FIG. 3 is a schematic illustration of an extended cavity FP laser assembly capable of high speed optical modulation and narrow mode spacing, consistent with an embodiment.

Embodiments of the extended cavity FP laser assembly may provide the relatively narrow mode spacing by using an extended lasing cavity with a relatively large cavity length while allowing the relatively high speed optical modulation by using a relatively small gain region volume. As shown in FIG. 3, an embodiment of an extended cavity FP laser assembly 302 includes a laser emitter 310 and an exit reflector 318 physically separated from the laser emitter 310 to form an extended lasing cavity 320. The exit reflector 318 may be integrated with an optical waveguide 330, such as an optical fiber or a waveguide in an AWG, optically coupled to but physically separated from the laser emitter 310. In the illustrated embodiment, the exit reflector 318 is located on a light coupling end 332 of the optical waveguide 330. The laser emitter 310 is optically coupled to the optical waveguide 330, for example, using a lens 340 to focus the light emitted from the laser emitter 310 onto the light coupling end 332 of the waveguide 320.

The laser emitter 310 includes a gain region 312 (e.g., a gain chip) that generates and amplifies light across the range of wavelengths to provide the gain that results in lasing when the gain exceeds the cavity losses. The laser emitter 310 further includes a back reflector 314 on a back facet or side and an anti-reflective coating 316 on an opposite side optically coupled to the waveguide 330. The back reflector 314 reflects light from the laser emitter 310 and the anti-reflective coating 316 allows light to pass into and out of the gain region 312 of the laser emitter 310. The extended lasing cavity 320 is thus formed between the back reflector 314 and the exit reflector 318.

If the lasing cavity were formed only by the gain region 312 with the cavity length $L_1$ (e.g., with an exit reflector on the laser emitter 310), the FP mode spacing may be determined as follows: $\Delta\lambda = \lambda^2/2\, nL_1$ where n is the refractive index, $\lambda$ is a lasing wavelength, and $L_1$ is the length of the gain region 312. For a refractive index $n \approx 3.2$, a wavelength $\lambda \approx 1550$ nm, and a cavity length $L_1 \approx 250$ μm, for example, the mode spacing $\Delta\lambda$ would be about 1.5 nm and thus would be too wide for a DWDM 100 GHz system (i.e., $\Delta\lambda \ll 0.4$ nm). To provide a desired mode spacing of $\Delta\lambda \approx 0.1$ nm for such a system, for example, the gain region cavity length $L_1$ would need to be about 3.6 mm, which would be too long for optical modulation at a data rate of 1 Gbps or greater.

The total lasing cavity length of the extended cavity FP laser assembly 302 is thus extended by the additional length ($L_2$) to the exit reflector 318 while maintaining a relatively short cavity length ($L_1$) for the gain region 312. For the extended cavity FP laser assembly 302, the FP mode spacing may thus be determined as follows: $\Delta\lambda = \lambda^2/(2\, n_1 L_1 + 2\, n_2 L_2)$ where $n_1$ is the refractive index for the gain region, $n_2$ is the refractive index for air, $\lambda$ is a lasing wavelength, $L_1$ is the length of the gain region 312, and $L_2$ is the additional length of the external cavity portion. As a result, the shorter cavity length ($L_1$) for the gain region 312 enables high speed optical modulation (e.g., >1 Gbps) of the gain region 312 while the longer total lasing cavity length ($L_1 + L_2$) enables a narrower mode spacing $\Delta\lambda$ (e.g., $\Delta\lambda \ll 0.4$ nm). In one example of an extended cavity FP laser assembly for use in a WDM-PON, the gain region length ($L_1$) is less than about 1000 μm and the additional length ($L_2$) is in a range of at least about 9 mm.

Each laser emitter 310 may include multiple quantum-well active regions or other gain media capable of emitting a spectrum of light across a range of wavelengths and capable of amplifying light reflected back into the gain media. The laser emitter 310 may be, for example, a gain chip such as a semiconductor diode, a reflective semiconductor optical amplifier (R-SOA), a super-luminescent light emitting diode, or other light emitting modules. In some embodiments, the laser emitter 310 may be capable of emitting a range of wavelengths across the full spectrum of channel wavelengths in a WDM optical system (e.g., the C-band, the L-band, or both). In other embodiments, the laser emitter 310 may be broadly tunable to emit a subset of channel wavelengths in the WDM optical system.

The back reflector 314 may be highly reflective (e.g., at least 80% reflective) and may include a cleaved facet on a laser or gain chip, a reflective coating on the chip, or a distributed Bragg reflector (DBR) on the gain chip or separate from the gain chip. In one embodiment, the back reflector 314 may be about 80-90% reflectivity to allow a portion of light to pass through the back for sensing by a monitor photodiode (not shown). The anti-reflective coating 316 may include a high quality anti-reflective (AR) coating on the other facet of the gain chip such light passes out of the gain region 312 without reflection or with a reflectivity as small as possible (e.g., less than 1% reflective). The exit reflector 318 is sufficiently partially reflective (e.g., about 50% reflectivity) to achieve lasing and may be formed by an LR coating on the light coupling end 332 of the waveguide 330.

Figure 4:
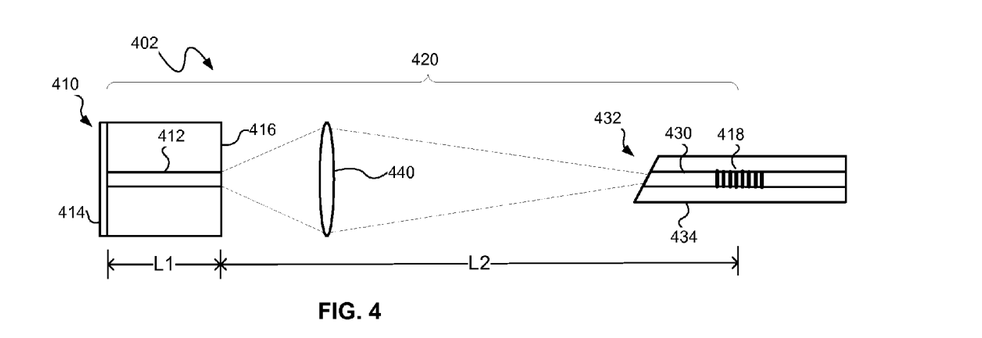
FIG. 4 is a schematic illustration of an extended cavity FP laser assembly with an extended lasing cavity extending into a waveguide, consistent with another embodiment.
Figure 5:
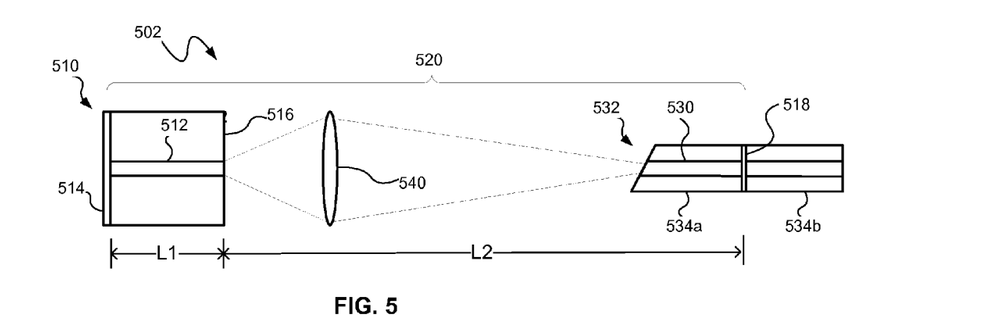
FIG. 5 is a schematic illustration of an extended cavity FP laser assembly with an extended lasing cavity extending into a waveguide, consistent with a further embodiment.

FIGS. 4 and 5 show additional embodiments of extended cavity FP laser assemblies 402, 502 with the lasing cavity extended further into a waveguide to allow relatively narrow mode spacing over an extended range of wavelengths (e.g., the C-band and L-band) while maintaining a desired optical coupling efficiency between laser emitters 410, 510 and waveguides 430, 530. If the exit reflector 318 and waveguide 330 described above were moved farther away to extend the lasing cavity 320, the light may not be sufficiently optically coupled into the waveguide 330. The extended cavity FP laser assemblies 402, 502 provide exit reflectors 418, 518 within the waveguide 430, 530 and beyond a light coupling end 432, 532 of the waveguide 430, 530, thereby further extending an external cavity 420, 520 while allowing the laser light to be optically coupled into the light coupling end 432, 532 of the waveguide 430, 530.

As shown in FIG. 4, the exit reflector 418 may be a distributed Bragg reflector (DBR) within the waveguide 430 to extend the lasing cavity 420 beyond the light coupling end 432 of the waveguide 430. The waveguide 430 may include, for example, an optical fiber and the exit reflector 418 may include a fiber Bragg grating formed in the optical fiber. In this embodiment, light coupling end 432 may have an angled end face and anti-reflective coating to facilitate optical coupling. As described above, the laser emitter 410 includes a gain region 412 between a back reflector 414 and an anti-reflective coating 416 and is optically coupled to the waveguide 430 with a lens 440.

As shown in FIG. 5, the exit reflector 518 may be located between segments 534a, 534b of the waveguide 530 to extend the lasing cavity beyond the light coupling end 532 of the waveguide 530. The waveguide 530 may include fiber segments 534a, 534b, for example, and the exit reflector 518 may be a partially reflective coating on at least one end of the fiber segments 534a, 534b. In this embodiment, the light coupling end 532 of the fiber segment 534a may have an angled end face and anti-reflective coating to facilitate optical coupling. As described above, the laser emitter 510 includes a gain region 512 between a back reflector 514 and an anti-reflective coating 516 and is optically coupled to the waveguide 530 with a lens 540.

In one example, the exit reflector 418, 518 may be located at a distance in a range of about 2 mm beyond the light coupling end 432, 532. These embodiments of the extended cavity FP laser assemblies 402, 502 may thus further extend the lasing cavity to a total cavity length ($L_1 + L_2$) in a range of about 9 to 12 mm.

Other types of waveguides and exit reflectors are also within the scope of the present disclosure. The waveguides may include, for example, waveguides in an arrayed waveguide grating (AWG) and the exit reflectors may include DBRs located in the waveguides. In other embodiments, the exit reflector may include a narrow band tunable reflector capable of being tuned (e.g., by changing temperature) to change the wavelength spectrum reflected back to the laser emitter.

Figure 6:
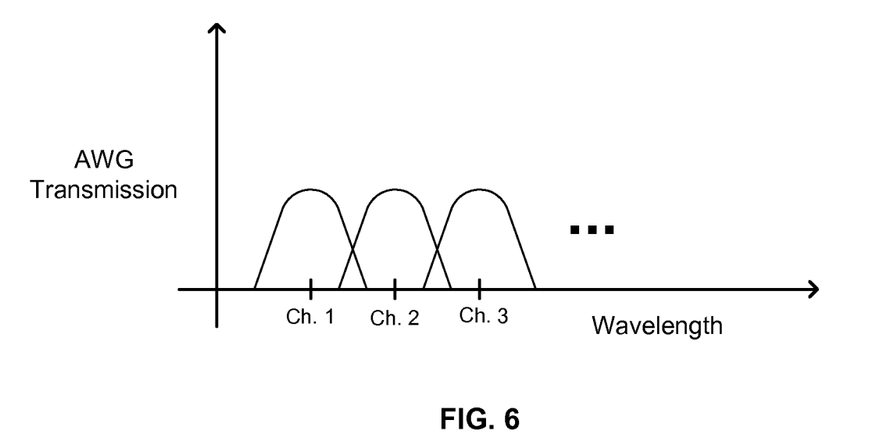
FIG. 6 illustrates transmitted channel bands or passbands of an arrayed waveguide grading (AWG) that may be used to filter output of the transmitter to a selected channel wavelength.
Figure 7:
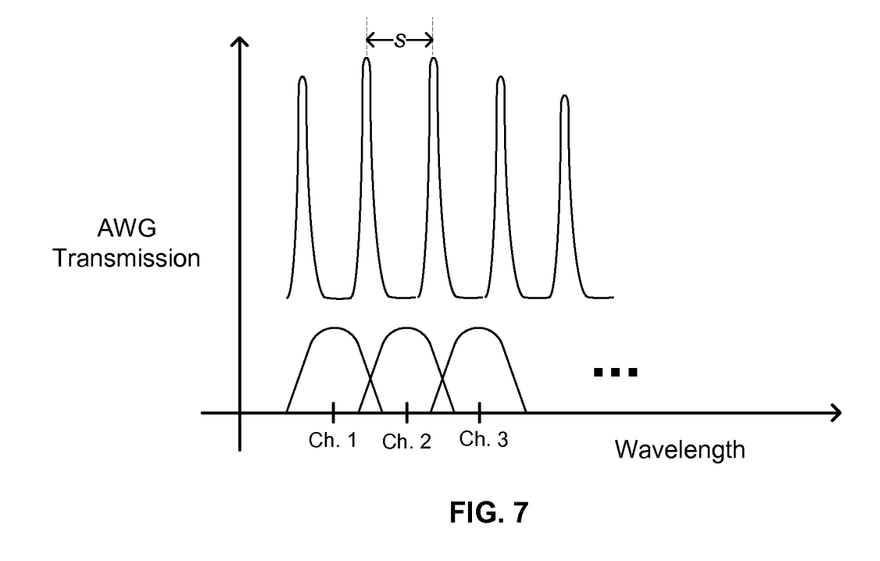
FIG. 7 illustrates laser output power as a function of wavelength for a regular Fabry-Perot laser together with the AWG transmitted channel bands.
Figure 8:
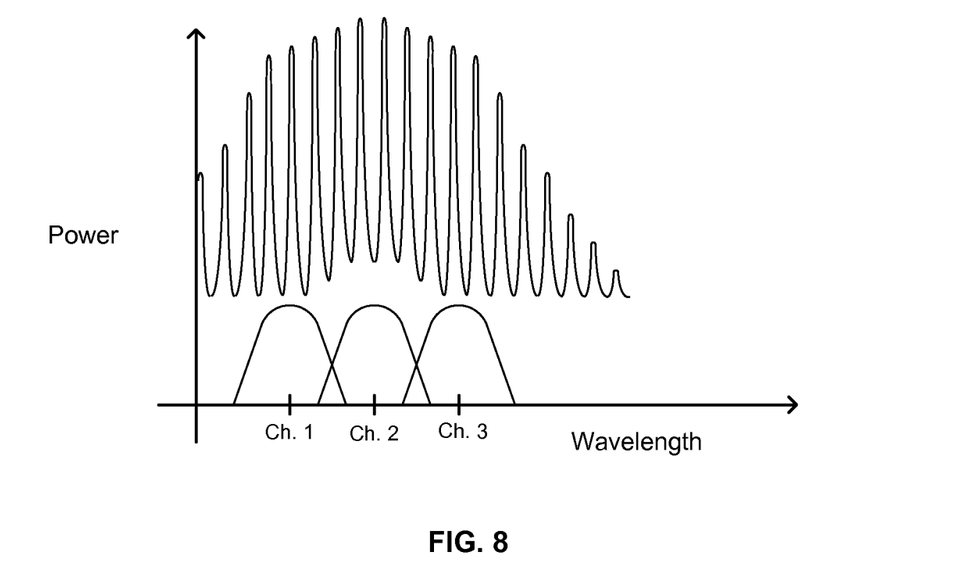
FIG. 8 illustrates laser output power as a function of wavelength for an extended cavity Fabry-Perot laser assembly with narrow mode spacing.
Figure 9:
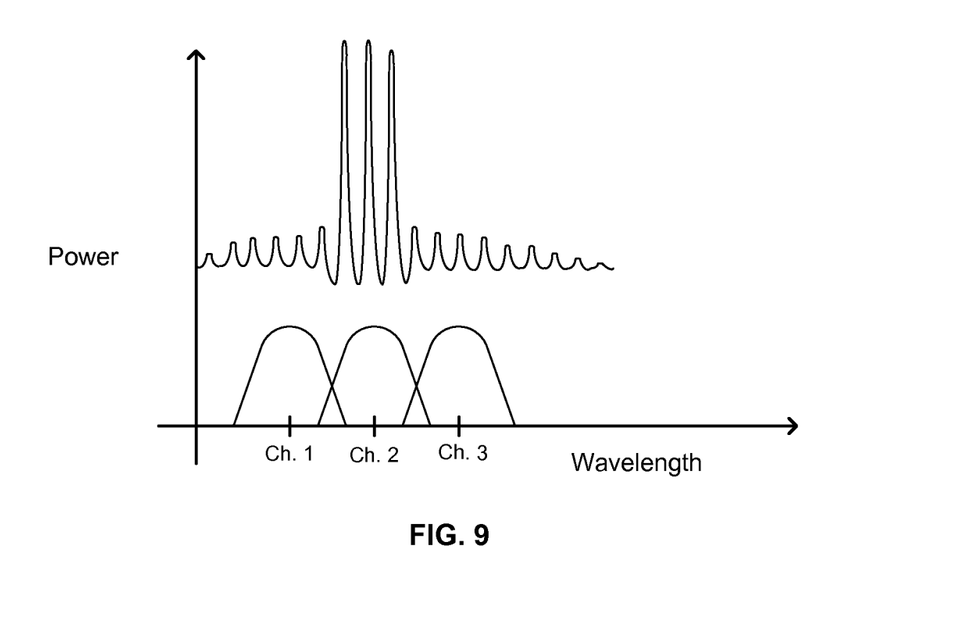
FIG. 9 illustrates laser output power as a function of wavelength for an extended cavity Fabry-Perot laser assembly with narrow mode spacing after being filtered by the AWG to select a channel wavelength.

The extended cavity FP laser assemblies described above are thus capable of providing a relatively narrow mode spacing such that multiple modes (e.g., approximately 3) will fit within each passband of the filters used to select channel wavelengths in a WDM system. As shown in FIG. 6, for example, an AWG is capable of passing a range or band of wavelengths around each of the channel wavelengths. If the mode spacing (S) in the FP laser is too wide, as shown in FIG. 7, the modes or peaks may not correspond with a desired channel wavelength to be selected. Using an extended cavity FP laser assembly to narrow the mode spacing, as shown in FIG. 8, ensures that at least one of the modes or peaks will pass within each of the channel wavelength bands after the AWG. As shown in FIG. 9, for example, three modes pass through the channel wavelength band for the second channel. With an AWG having a channel passband of about 0.4 nm, for example, a mode spacing of about 0.1 nm should allow three modes to pass through the channel wavelength band.

Accordingly, the extended cavity FP laser assembly, consistent with embodiments described herein, is capable of relatively narrow mode spacing while allowing relatively high speed optical modulation in a WDM optical system.

Consistent with an embodiment, an extended cavity Fabry-Perot laser assembly includes a laser emitter including a gain region for emitting light across a range of wavelengths including a plurality of channel wavelengths and a back reflector located at one end thereof. The gain region has a gain region cavity length capable of optical modulation at a data rate of at least about 1 Gbps. The extended cavity Fabry-Perot laser assembly further includes an optical waveguide optically coupled to and a physically separated from the gain region. The light emitted from the gain region is optically coupled into a light coupling end of the optical waveguide and the optical waveguide includes an exit reflector. An extended lasing cavity is formed between the back reflector and the exit reflector, and the extended lasing cavity has a length such that a mode spacing of the laser light emitted from the lasing cavity is less than about 0.8 nm.

Consistent with another embodiment, a wavelength division multiplexed (WDM) optical system is provided for transmitting optical signals at a plurality of system channel wavelengths. The WDM optical system includes a plurality of multi-channel transmitters, and each of the multi-channel transmitters are associated with an associated channel and channel wavelength and configured to transmit optical signals at multiple channel wavelengths including the associated channel wavelength. Each of the multi-channel transmitters include a laser emitter including a gain region for emitting light across a range of wavelengths including the multiple channel wavelengths and a back reflector located at one end thereof. The WDM optical system also includes a plurality of optical waveguides optically coupled to and a physically separated from the laser emitters, respectively. The light emitted from the gain region in each of the laser emitters is optically coupled into a light coupling end of a respective one of the optical waveguides. Each of the optical waveguides further includes an exit reflector such that an extended lasing cavity is formed between the back reflector and the exit reflector. The WDM optical system further includes a plurality of filters for receiving optical signals output from the multi-channel transmitters, respectively. Each of the filters is configured to filter an optical signal from a respective one of the multi-channel transmitters such that the associated channel wavelength for the respective one of the multi-channel transmitters is selected from the multiple channel wavelengths transmitted by the respective one of the multi-channel transmitters. The extended lasing cavity provides a mode spacing such that multiple lasing modes fit within a passband of a respective one of the filters. An optical multiplexer configured to combine the selected associated channel wavelengths for the respective transmitters into a multiplexed optical signal.

Consistent with a further embodiment, a WDM optical transmission method is provided for transmitting optical signals at a plurality of WDM system channel wavelengths. The WDM optical transmission method includes: modulating a plurality of extended cavity Fabry-Perot laser assemblies in a plurality of multi-channel transmitters with a plurality of RF signals, respectively, to transmit a plurality of optical signals from the multi-channel transmitters, respectively, each of the plurality of optical signals being transmitted at multiple channel wavelengths, wherein a mode spacing of the laser light emitted from each of the extended cavity Fabry-Perot laser assemblies is less than a channel spacing of the WDM system channel wavelengths; filtering the optical signals to select a different associated channel wavelength for each of the multi-channel transmitters from the plurality of channel wavelengths transmitted by each of the multi-channel transmitters; and combining the selected channel wavelengths into an aggregate wavelength division multiplexed optical signal carried on an optical path.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A wavelength division multiplexed (WDM) optical system for transmitting optical signals at a plurality of system channel wavelengths, the WDM optical system comprising:

a plurality of multi-channel transmitters, each of the multi-channel transmitters being associated with an associated channel and channel wavelength and configured to transmit optical signals at multiple channel wavelengths including the associated channel wavelength, each of the multi-channel transmitters comprising a laser emitter including a gain region for emitting light across a range of wavelengths including the multiple channel wavelengths and a back reflector located at one end thereof, wherein the gain region has a gain region cavity length capable of optical modulation at a data rate of at least about 1 Gbps, wherein the extended lasing cavity has a length such that a mode spacing of the laser light emitted from the lasing cavity is less than about 0.4 nm, wherein the gain region cavity has a length of less than about 1000 µm;

a plurality of optical waveguides optically coupled to and physically separated from the laser emitters, respectively, wherein the light emitted from the gain region in each of the laser emitters is optically coupled into a light coupling end of a respective one of the optical waveguides, and wherein each of the optical waveguides includes an exit reflector such that an extended lasing cavity is formed between the back reflector and the exit reflector, and the extended lasing cavity between the back reflector and the exit reflector has a length of at least about 9 mm;

a plurality of filters for receiving optical signals output from the multi-channel transmitters, respectively, each of the filters being configured to filter an optical signal from a respective one of the multi-channel transmitters such that the associated channel wavelength for the respective one of the multi-channel transmitters is selected from the multiple channel wavelengths transmitted by the respective one of the multi-channel transmitters, wherein the extended lasing cavity provides a mode spacing such that multiple lasing modes fit within a passband of a respective one of the filters; and an optical multiplexer configured to combine the selected associated channel wavelengths for the respective transmitters into a multiplexed optical signal, wherein the optical waveguides, the filter and the optical multiplexer are integrated as an arrayed waveguide grating (AWG), and wherein the extended lasing cavity has a length configured to provide the mode spacing such that the multiple lasing modes fit within a channel passband of the AWG.

2. The WDM optical system of claim 1 wherein the optical waveguides are located in the multi-channel transmitters.

3. The WDM optical system of claim 1 further comprising a plurality of optical networking terminals (ONTs) in a WDM passive optical network (PON), wherein the plurality of multi-channel transmitters are located in the plurality of ONTs, respectively.

4. The WDM optical system of claim 1 further comprising at least one optical line terminal (OLT) in a WDM passive optical network (PON), wherein the plurality of multi-channel transmitters are located in the at least one OLT.

5. The WDM optical system of claim 1 wherein the plurality of channel wavelengths include wavelengths in the L-band, the C-band, or both.

6. A WDM optical transmission method for transmitting optical signals at a plurality of WDM system channel wavelengths, the WDM optical transmission method comprising:

modulating a plurality of extended cavity Fabry-Perot laser assemblies in a plurality of multi-channel transmitters with a plurality of RF signals, respectively, to transmit a plurality of optical signals from the multi-channel transmitters, respectively, each of the plurality of optical signals being transmitted at multiple channel wavelengths with a data rate of at least about 1 Gbps;

passing the optical signals through an arrayed waveguide grating (AWG) for filtering the optical signals to select a different associated channel wavelength for each of the multi-channel transmitters from the plurality of channel wavelengths transmitted by each of the multi-channel transmitters, wherein a mode spacing of the laser light emitted by each of the extended cavity Fabry-Perot laser assemblies is less than a channel passband for each respective channel of the AWG and is less than about 0.4 nm, wherein the gain region cavity has a length of less than about 1000 µm, and the extended lasing cavity between a back reflector of the gain region cavity and an exit reflector of the AWG has a length of at least about 9 mm; and combining the selected channel wavelengths in the AWG into an aggregate wavelength division multiplexed optical signal carried on an optical path.

7. The WDM optical transmission method of claim 6 wherein the mode spacing of the laser light emitted by each of the extended cavity Fabry-Perot laser assemblies allows at least three modes to fit within the passband for each respective channel of the AWG.

8. The WDM optical transmission method of claim 6 wherein the plurality of channel wavelengths include wavelengths in the L-band, in the C-band, or both.

* * * * *